United States Patent
Fujimura et al.

(10) Patent No.: US 11,871,522 B2
(45) Date of Patent: Jan. 9, 2024

(54) COMPONENT MOUNTING MACHINE

(71) Applicant: FUJI CORPORATION, Chiryu (JP)

(72) Inventors: Shingo Fujimura, Toyoake (JP); Kenji Watanabe, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/770,524

(22) PCT Filed: Oct. 25, 2019

(86) PCT No.: PCT/JP2019/042011
§ 371 (c)(1),
(2) Date: Apr. 20, 2022

(87) PCT Pub. No.: WO2021/079512
PCT Pub. Date: Apr. 29, 2021

(65) Prior Publication Data
US 2022/0408623 A1    Dec. 22, 2022

(51) Int. Cl.
*H05K 13/08* (2006.01)
*H05K 13/04* (2006.01)

(52) U.S. Cl.
CPC ..... *H05K 13/0882* (2018.08); *H05K 13/0409* (2018.08)

(58) Field of Classification Search
CPC ........... H05K 13/0408; H05K 13/0409; H05K 13/0882; H05K 13/0885
See application file for complete search history.

(56) References Cited

U.S. PATENT DOCUMENTS

| 2014/0225438 A1 | 8/2014 | Eguchi et al. |
| 2019/0254202 A1* | 8/2019 | Kondo ............... H05K 13/0069 |
| 2022/0408623 A1* | 12/2022 | Fujimura ........... H05K 13/0885 |

FOREIGN PATENT DOCUMENTS

| JP | 4604127 B2 | 12/2010 |
| JP | 2011-228472 A | 11/2011 |
| JP | 5810170 B2 | 11/2015 |
| WO | WO 2015/019457 A1 | 2/2015 |

OTHER PUBLICATIONS

International Search Report dated Jan. 21, 2020 in PCT/JP2019/042011 filed on Oct. 25, 2019 (2 pages).

* cited by examiner

*Primary Examiner* — Minh N Trinh
(74) *Attorney, Agent, or Firm* — Oblon, McClelland, Maier & Neustadt, L.L.P.

(57) ABSTRACT

A control device configured to control a component pickup and mounting operation of a component mounting machine; and multiple devices configured to execute the component pickup and mounting operation are provided. A device out of the multiple devices is attachably and detachably attached to the component mounting machine and includes a field programmable gate array that operates each function of the device by communicating with the control device. The field programmable gate array has a clock gating function of reducing an electric current flowing into the attachable and detachable device by stopping processing on a function that is not used, out of individual functions of the attachable and detachable device, when the attachable and detachable device is in a state capable of being removed by an operator.

6 Claims, 2 Drawing Sheets

COMPONENT MOUNTING MACHINE

TECHNICAL FIELD

The present specification discloses a technique related to a component mounting machine that mounts a component on a circuit board.

BACKGROUND ART

As described in Patent Literature 1 (International Publication No. WO2015/019457), a component mounting machine is disclosed in which a mounting head that exchangeably holds multiple suction nozzles is detachably (exchangeably) attached to a head holding section of the component mounting machine. In this case, the mounting head is provided with various electrical components such as a servo motor serving as a driving source, an electromagnetic valve that turns on/off the supply of negative pressure to a suction nozzle, and a pressure sensor that detects the negative pressure to be supplied, and wirings for the electrical components are connected to the component mounting machine side via a connector.

PATENT LITERATURE

Patent Literature 1: International Publication No. WO2015/019457

BRIEF SUMMARY

Technical Problem

For example, the power supply to the mounting head is turned off in advance so that an operator can remove the mounting head from the component mounting machine when the operator exchanges a suction nozzle. This is because, when the mounting head is removed while power is supplied to the mounting head, a high voltage may be generated in the circuit on the power supply side to damage the electronic component.

However, when the power supply to the mounting head is turned off in advance, it takes time before the power supply to the mounting head is resumed after the exchange of the suction nozzle and rebooting is completed, so that it takes time before production can be resumed.

In addition, the mounting head is not necessarily removed from the component mounting machine for operation when an operator exchanges the suction nozzle, and the operation may be performed in a state in which the mounting head is attached to the component mounting machine. In this case, when the mounting head is not removed from the component mounting machine, the suction nozzle can be safely exchanged even in a case where the power supply to the mounting head remains on, so that production can be resumed immediately after the exchange.

However, since the component mounting machine side does not know in advance whether the operator removes the mounting head from the component mounting machine when exchanging the suction nozzle, the operator always turns off the power supply to the mounting head when exchanging the suction nozzle. Therefore, it is necessary to resume the power supply to the mounting head after the suction nozzle is exchanged and to perform rebooting, because the power supply to the mounting head is turned off even though the power supply to the mounting head does not actually have to be turned off when the operator exchanges the suction nozzle in a state in which the mounting head is attached to the component mounting machine, and it takes time before production can be resumed.

Solution to Problem

In order to solve the above-described problem, there is provided a component mounting machine that picks up a component supplied from a component supply device and mounts the component on a circuit board, the component mounting machine including: a control device configured to control a component pickup and mounting operation of the component mounting machine; and multiple devices configured to execute the component pickup and mounting operation, in which at least one device out of the multiple devices is attachably and detachably attached to the component mounting machine and the attachable and detachable device is provided with an FPGA that operates each function of the attachable and detachable device by communicating with the control device, and the FPGA has a clock gating function of reducing an electric current flowing into the attachable and detachable device by stopping processing on a function that is not used, out of individual functions of the attachable and detachable device, when the attachable and detachable device is in a state capable of being removed by an operator.

This configuration is a technical idea which focuses on the fact that the attachable and detachable device is provided with the FPGA operating each function of the attachable and detachable device by communicating with the control device of the component mounting machine, and which efficiently utilizes the clock gating function provided in the FPGA to solve the above-described problem. Specifically, the FPGA provided in the attachable and detachable device uses the clock gating function to reduce an electric current flowing into the attachable and detachable device by stopping processing on a function that is not used, out of individual functions of the attachable and detachable device, when the attachable and detachable device is in a state capable of being removed by the operator. In this case, since the electric current flowing into the attachable and detachable device is reduced by the clock gating function although induced voltage is generated in the circuit on the power supply side when the attachable and detachable device is actually removed by the operator, the induced voltage generated in the circuit on the power supply side when the attachable and detachable device is removed by the operator is decreased, so that it is possible to prevent the electronic component from being damaged. Accordingly, in a case where the attachable and detachable device is a mounting head, when the operator exchanges the suction nozzle in a state in which the mounting head is attached to the component mounting machine, production can be promptly resumed without performing rebooting after the exchange.

DESCRIPTION OF EMBODIMENTS

Hereinafter, two first and second embodiments disclosed in the present specification will be described.

First Embodiment

Figure 1:
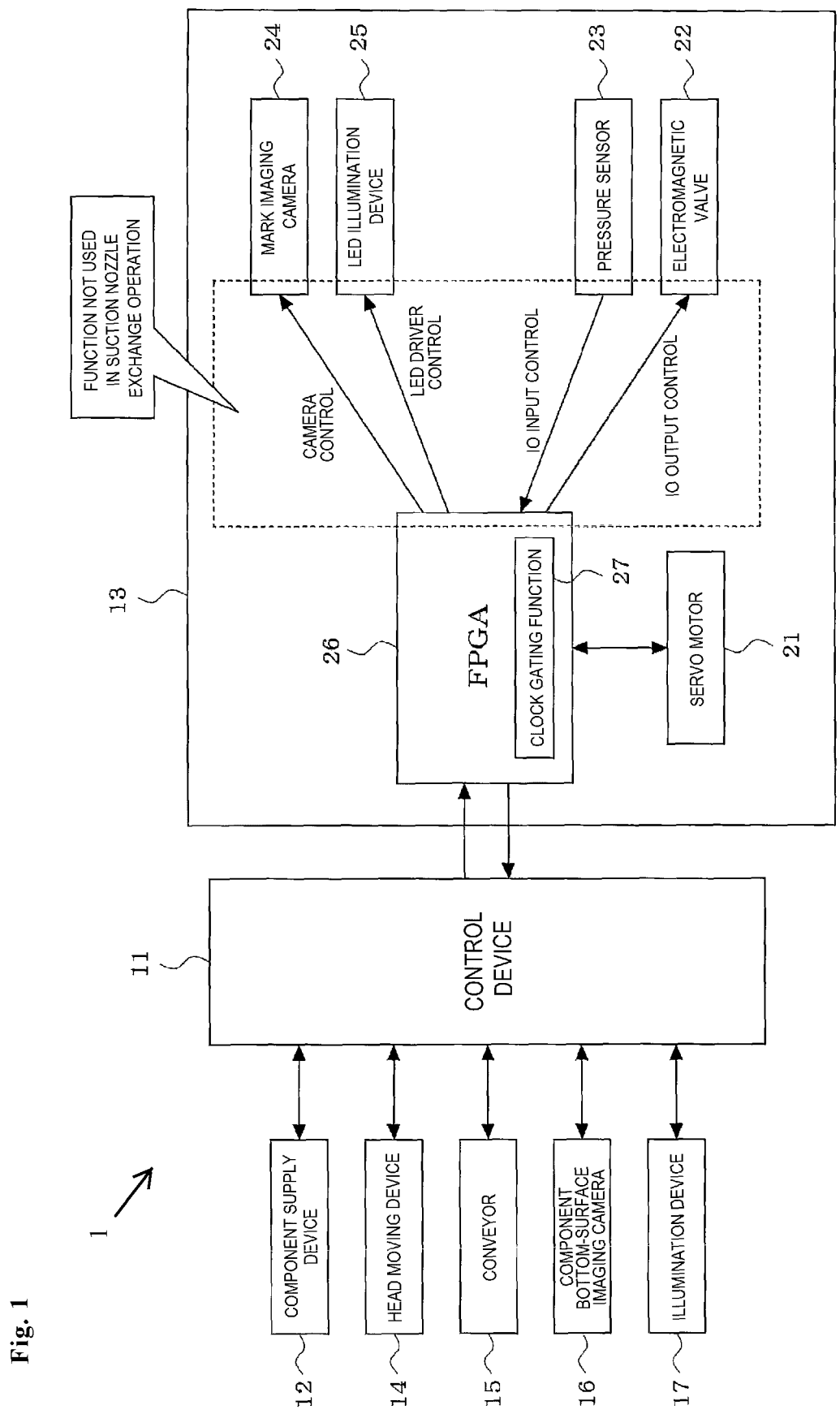
FIG. 1 is a block diagram showing a configuration of a control system of a mounting head of a first embodiment.

First, a first embodiment will be described with reference to FIG. 1. A component mounting machine 1 includes control device 11 that controls a component pickup and mounting operation, and multiple devices that are used to execute the component pickup and mounting operation. Here, as the multiple devices that are used to execute the component pickup and mounting operation, for example, component supply device 12, such as a tape feeder and a tray feeder, that supplies a component, mounting head 13 that attachably and detachably (exchangeably) holds a suction nozzle (not shown) which picks up the component supplied from component supply device 12, head moving device 14 that moves mounting head 13 in an XY direction, conveyor 15 that carries in/out a circuit board, component bottom-surface imaging camera 16 that images the component picked up by the suction nozzle from the bottom surface side thereof, and illumination device 17 that illuminates the bottom surface of the component which is an imaging target when the imaging of component bottom-surface imaging camera 16 are provided. In addition, although not shown, for example, a clamping device that clamps the circuit board carried in by conveyor 15, and a nozzle changer that stores a suction nozzle for exchange are provided.

Control device 11 of the component mounting machine is formed of a computer (CPU) as a main component, and controls the operations of the above-described multiple devices to execute the component pickup and mounting operation.

Mounting head 13 is provided with various electrical components such as at least one servo motor 21 serving as a driving source, electromagnetic valve 22 that turns on/off the supply of negative pressure to the suction nozzle, and pressure sensor 23 that detects the negative pressure to be supplied, and is also provided with mark imaging camera 24 that images a reference mark of the circuit board from above, LED illumination device 25 that illuminates an imaging target thereof, and the like. Wirings for various electrical components provided in mounting head 13 are connected to the side of control device 11 of the component mounting machine via a connector (not shown).

Mounting head 13, which is a device attachably and detachably attached to the component mounting machine, is provided with Field Programmable Gate Array (FPGA) 26 that operates each function (each electrical component) of mounting head 13 by communicating with control device 11 of the component mounting machine. FPGA 26 is an array (gate array IC) of multiple logic circuits that are programmable (rewritable) in the field, and has clock gating function 27. Clock gating function 27 reduces an electric current flowing into mounting head 13 by stopping processing on a function that is not used, out of individual functions of mounting head 13, when mounting head 13 is in a state capable of being removed (the suction nozzle can be exchanged) by the operator.

Here, whether mounting head 13 is in the state capable of being removed (the suction nozzle can be exchanged) by the operator is determined by any of the following three determination methods 1 to 3.

[Determination Method 1]

Control device 11 of the component mounting machine determines that mounting head 13 can be removed (the suction nozzle can be exchanged) by the operator, when the component mounting machine has stopped the component pickup and mounting operation (production), and causes FPGA 26 to operate clock gating function 27 by outputting a stop signal to FPGA 26. Whether the component mounting machine has stopped the component pickup and mounting operation (production) can be determined by control device 11 of the component mounting machine.

[Determination Method 2]

A detecting section (not shown) that detects opening of a front cover of the component mounting machine is provided, and control device 11 of the component mounting machine determines that mounting head 13 can be removed (the suction nozzle can be exchanged) by the operator, when the detecting section has detected the opening of the front cover, and causes FPGA 26 to operate clock gating function 27 by outputting a stop signal to FPGA 26. It is considered that the operator has to open the front cover of the component mounting machine in order to remove mounting head 13 from the component mounting machine.

[Determination Method 3]

Control device 11 of the component mounting machine determines that mounting head 13 can be removed (the suction nozzle can be exchanged) by the operator, when the operator has input an operation signal for performing operation such as the exchange of the suction nozzle with respect to mounting head 13 by operating an input device such as an operation panel (not shown), and causes FPGA 26 to operate clock gating function 27 by outputting a stop signal to FPGA 26.

In the first embodiment, since only processing on servo motor 21 is continued and the functions except for servo motor 21 are not used, out of individual functions of mounting head 13, when mounting head 13 is in a state capable of being removed (the suction nozzle can be exchanged) by the operator, the processing on the functions that are not used is stopped. In this case, examples of the functions that are not used include a function of controlling mark imaging camera 24, a function of controlling the LED driver of LED illumination device 25, a function of controlling the 10 input of pressure sensor 23, and a function of controlling the 10 output of electromagnetic valve 22.

In the first embodiment described above, when mounting head 13 is in a state capable of being removed by the operator, FPGA 26 provided in mounting head 13 that is attachably and detachably attached to the component mounting machine continues only processing on servo motor 21, and uses clock gating function 27 to reduce the electric current flowing into mounting head 13 by stopping processing on the function that is not used, out of individual functions of mounting head 13. In this case, since the electric current flowing into mounting head 13 is reduced by clock gating function 27 although induced voltage is generated in the circuit on the power supply side when mounting head 13 is actually removed by the operator, the induced voltage generated in the circuit on the power supply side when mounting head 13 is removed by the operator is decreased, so that it is possible to prevent the electronic component from being damaged. Accordingly, when the operator exchanges the suction nozzle in a state in which the mounting head 13 is attached to the component mounting machine, production can be promptly resumed without performing rebooting of FPGA 26 after the exchange.

Second Embodiment

A second embodiment will be described with reference to FIG. 2. It should be noted that the same reference numerals are assigned and the description thereof will be omitted and simplified for substantially the same portions as those in the above-described first embodiment, and description will be made mainly for different portions.

Figure 2:
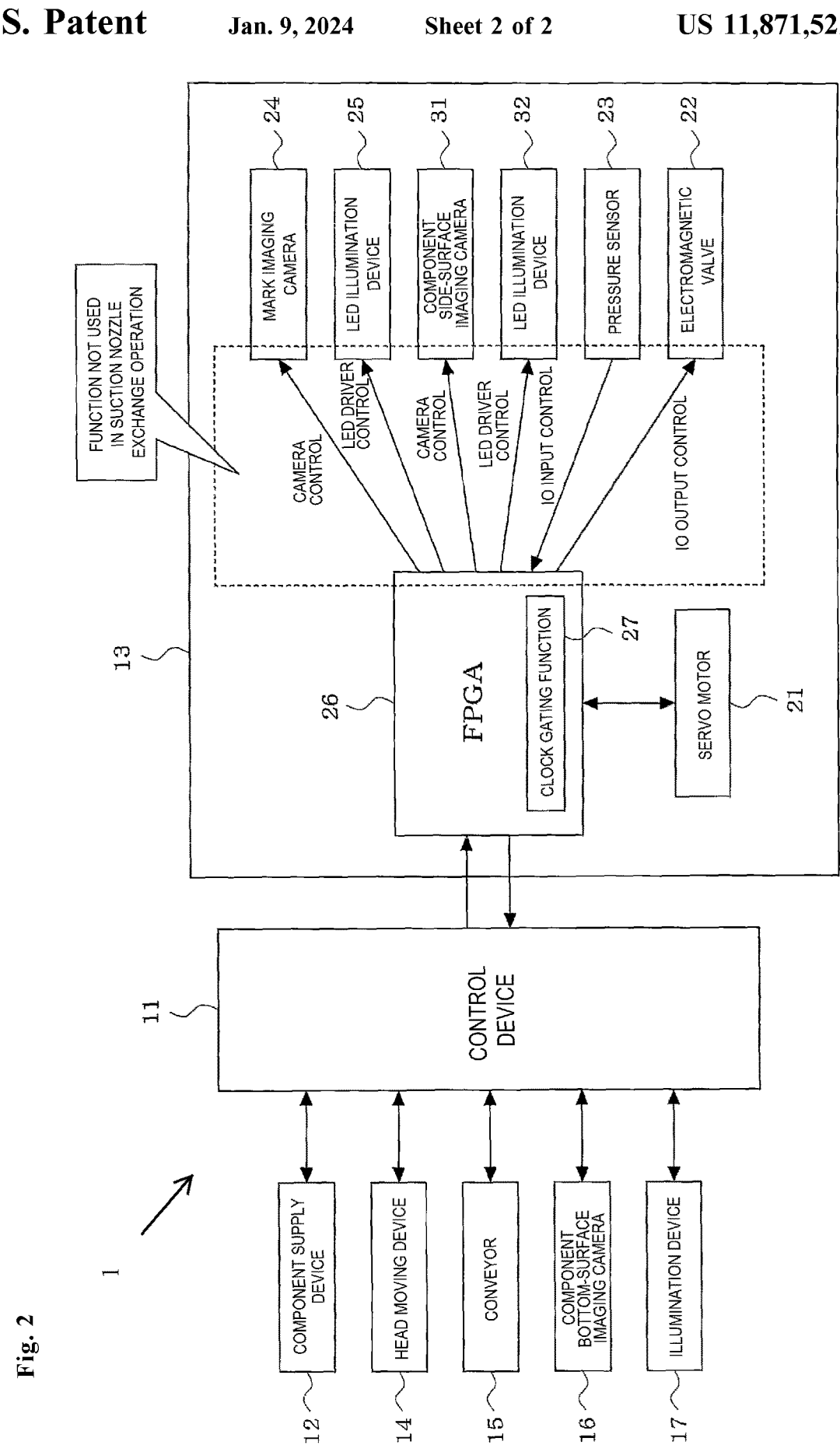
FIG. 2 is a block diagram showing a configuration of a control system of a mounting head of a second embodiment.

In the second embodiment shown in FIG. 2, mounting head 13 is provided with component side-surface imaging camera 31 that images a component picked up by the suction nozzle from the side-surface side thereof, and LED illumination device 32 that illuminates a side surface of the component which is an imaging target when the imaging of component side-surface imaging camera 31, in addition to mark imaging camera 24 and LED illumination device 25.

Also in the second embodiment, when mounting head 13 is in a state capable of being removed (the suction nozzle can be exchanged) by the operator, processing on a function that is not used, out of individual functions of mounting head 13, is stopped so that an electric current flowing into mounting head 13 is reduced. In this case, the functions that are not used out of individual functions of mounting head 13 include a function of controlling component side-surface imaging camera 31 and a function of controlling the LED driver of LED illumination device 32, in addition to each function described in the first embodiment. The other configuration is the same as the configuration of the first embodiment. Also in the second embodiment described above, the same effect as in the first embodiment can be obtained.

It should be noted that the present disclosure is not limited to the above-described first and second embodiments, and in a case where even a device other than mounting head 13 is attachable to and detachable from the component mounting machine and is provided with an FPGA that operates each function of the attachable and detachable device by communicating with control device 11 of the component mounting machine, the present disclosure can be applied and carried out for the attachable and detachable device.

In addition, it goes without saying that the present disclosure may be implemented by various changes within the scope that does not depart from the gist, for example, the configuration of the component mounting machine or the configuration of mounting head 13 may be appropriately changed.

REFERENCE SIGNS LIST

11: control device, 12: component supply device, 13: mounting head (attachable and detachable device), 21: servo motor, 22: electromagnetic valve, 23: pressure sensor, 24: mark imaging camera, 25: LED illumination device, 26: FPGA, 27: clock gating function, 31: component side-surface imaging camera, 32: LED illumination device

The invention claimed is:

1. A component mounting machine that picks up a component supplied from a component supply device and mounts the component on a circuit board, the component mounting machine comprising:
   multiple devices that execute a component pickup and mounting operation of the component mounting machine to pick up and mount the component, the multiple devices including:
      the component supply device,
      an attachable and detachable device that is attachably and detachably attached to the component mounting machine and that picks up the component supplied from the component supply device,
      a moving device that moves the attachable and detachable device, and
      a conveyor that carries the circuit board;
   a control device operably connected to the multiple devices and programmed to control the multiple devices to execute the component pickup and mounting operation of the component mounting machine; and, wherein
   the attachable and detachable device is provided with a field programmable gate array (FPGA) that is programmed to operate each of a plurality of functions of the attachable and detachable device by communicating with the control device, and
   the FPGA is programmed to have a clock gating function of reducing an electric current flowing into the attachable and detachable device by stopping processing on a function that is not used, out of the functions of the attachable and detachable device, when the attachable and detachable device is in a state capable of being removed by an operator.

2. The component mounting machine according to claim 1, wherein
   the attachable and detachable device is a mounting head, and
   the mounting head attachably and detachably holds a suction nozzle, and
   the suction nozzle picks up the component supplied from the component supply device.

3. The component mounting machine according to claim 1, wherein the control device is programmed to:
   determine that the attachable and detachable device can be removed by the operator when the component mounting machine has stopped the component pickup and mounting operation, and
   cause the FPGA to operate the clock gating function by outputting a stop signal to the FPGA.

4. The component mounting machine according to claim 1, further comprising:
   a detecting section that detects opening of a front cover of the component mounting machine,
   wherein the control device is programmed to:
      determine that the attachable and detachable device can be removed by the operator when the detecting section has detected the opening of the front cover, and
      cause the FPGA to operate the clock gating function by outputting a stop signal to the FPGA.

5. The component mounting machine according to claim 1, wherein the control device is programmed to:
   determine that the attachable and detachable device can be removed by the operator when the operator has input an operation signal for performing an operation with respect to the attachable and detachable device, and
   cause the FPGA to operate the clock gating function by outputting a stop signal to the FPGA.

6. The component mounting machine according to claim 1, wherein
   the attachable and detachable device includes a servo motor as at least one of the functions, and
   the FPGA is programmed to continue processing on the servo motor and stop processing on a function except for the servo motor, out of the functions of the attachable and detachable device, when the attachable and detachable device is in the state capable of being removed by the operator.

* * * * *